US010023973B2

(12) United States Patent
Dell'Amico et al.

(10) Patent No.: US 10,023,973 B2
(45) Date of Patent: Jul. 17, 2018

(54) DOPANT FEEDING DEVICE FOR DISPENSING DOPANT

(71) Applicant: MEMC Electronic Materials S.p.A., Novara (IT)

(72) Inventors: Gianni Dell'Amico, Merano (IT); Ugo Delpero, Marlengo (IT); Mauro Diodà, Bolzano (IT); Stephan Haringer, Castelbello/Ciardes (IT)

(73) Assignee: MEMC Electronic Materials S.P.A., Novara (IT)

( * ) Notice: Subject to any disclaimer, the term of this patent is extended or adjusted under 35 U.S.C. 154(b) by 196 days.

(21) Appl. No.: 14/906,462

(22) PCT Filed: Jun. 7, 2013

(86) PCT No.: PCT/IT2013/000161
§ 371 (c)(1),
(2) Date: Jan. 20, 2016

(87) PCT Pub. No.: WO2014/195980
PCT Pub. Date: Dec. 11, 2014

(65) Prior Publication Data
US 2016/0298259 A1 Oct. 13, 2016

(51) Int. Cl.
*C30B 15/04* (2006.01)
*C30B 15/02* (2006.01)
(Continued)

(52) U.S. Cl.
CPC ............ *C30B 15/04* (2013.01); *C30B 15/002* (2013.01); *C30B 15/02* (2013.01); *C30B 15/20* (2013.01); *C30B 29/06* (2013.01)

(58) Field of Classification Search
CPC ....... C30B 15/00; C30B 15/002; C30B 15/02; C30B 15/04; C30B 15/20; C30B 29/00;
(Continued)

(56) References Cited

U.S. PATENT DOCUMENTS 5,242,531 A * 9/1993 Klingshirn .............. C30B 15/02
117/21
5,462,010 A * 10/1995 Takano .................... B01J 8/002
117/14
(Continued)

FOREIGN PATENT DOCUMENTS

JP          03103388         4/1991
JP          08295591        11/1996
(Continued)

OTHER PUBLICATIONS

International Search Report and Written Opinion of the International Searching Authority dated Oct. 11, 2013 regarding PCT/IT2013/000161; pp. 9.

*Primary Examiner* — Kenneth A Bratland, Jr.
(74) *Attorney, Agent, or Firm* — Armstrong Teasdale LLP

(57) ABSTRACT

A dopant feeding device for releasing dopant into a feeder system during doping of a crystal growing system includes a dopant container for holding the dopant, a lower valve, and an upper valve. The dopant container includes a wall defining a lower opening for releasing the dopant therethrough. The lower valve is positioned adjacent to the lower opening and is movable between a closed position that is in contact with the wall to prevent passage of dopant through the lower opening and an open position that is spaced from the lower opening to allow passage of dopant therethrough. The upper valve is positioned above and connected to the lower valve. The upper valve is disposed within the dopant container and is movable between a first position that is spaced from the dopant container and a second position that is in contact with the dopant container.

13 Claims, 2 Drawing Sheets

(51) Int. Cl.
   *C30B 15/00* (2006.01)
   *C30B 15/20* (2006.01)
   *C30B 29/06* (2006.01)

(58) Field of Classification Search
   CPC ......... C30B 29/02; C30B 29/06; C30B 21/00;
      C30B 21/02; Y10T 117/00; Y10T 117/10;
      Y10T 117/1004; Y10T 117/1008; Y10T
      117/1024; Y10T 117/1032; Y10T
      117/1056; Y10T 117/1072
   USPC ..... 117/2, 11, 13–15, 19, 21, 200–202, 206,
      117/208, 214, 218, 928, 931–932
   See application file for complete search history.

(56) References Cited

U.S. PATENT DOCUMENTS

| | | | |
|---|---|---|---|
| 6,019,841 A * | 2/2000 | Jafri | ................ C30B 15/20 117/14 |
| 7,922,817 B2 | 4/2011 | Javidi et al. | |
| 2009/0266294 A1 | 10/2009 | Javidi et al. | |
| 2010/0132829 A1 | 6/2010 | Javidi et al. | |

FOREIGN PATENT DOCUMENTS

| | | | |
|---|---|---|---|
| JP | 2002255684 A | 9/2002 |
| JP | 2005272265 A | 10/2005 |
| JP | 2010222162 A | 10/2010 |
| JP | 2012066965 A | 4/2012 |
| KR | 1093925 B1 | 12/2011 |
| WO | 9935310 A1 | 7/1999 |

* cited by examiner

DOPANT FEEDING DEVICE FOR DISPENSING DOPANT

CROSS-REFERENCE TO RELATED APPLICATIONS

This application is a National Stage application of International Application No. PCT/IT2013/000161, filed on Jun. 7, 2013, the disclosure of which is hereby incorporated by reference in its entirety.

FIELD

The field relates generally to the preparation of ingots of semiconductor or solar-grade material, more particularly, to methods and devices for dispensing dopant during the production of ingots.

BACKGROUND

Single crystal silicon, which is the starting material for most processes for the fabrication of semiconductor electronic devices and solar cells, is commonly prepared by the so-called Continuous Czochralski ("CCz") or Czochralski ("Cz") methods. In these methods, polysilicon in the form of a solid feedstock material is charged to a crucible and melted, a seed crystal is brought into contact with the molten silicon or a melt, and a single crystal is grown by slow extraction.

Dopant may be added to the melt to achieve a resistivity in the silicon. Conventionally, the silicon melt is doped by feeding a dopant into the melt from a feed hopper located above the silicon melt during a dopant step.

Improper doping can lead to LZD (loss of crystalline structure) during growth of the crystal in a later process stage (e.g. crown, body, etc.). Improper doping may be caused, for example, by providing the wrong amount of dopant and/or providing the dopant at the wrong time in the process. Air (oxygen), moisture, and/or other contaminants may enter the dopant feeding system while dopant is being loaded. The introduction of air and moisture into the system should be avoided, or the air must be removed before the doping step, to prevent formation of silicon monoxide, dopant oxide, sub oxides, and other particles formed by the air and moisture reacting with the internal parts of the furnace, dopant, or the silicon charge.

A need exists for a simple, cost-effective approach to controlling the feeding of the dopant into the silicon melt to regulate the quantity of dopant, the time of feeding the dopant, and to prevent air and moisture from entering the system during the Czochralski process of growing a crystal ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

A first aspect is a dopant feeding device for releasing dopant into a feeder system during doping of a crystal growing system. The dopant feeding device includes a dopant container for holding the dopant, a lower valve, and an upper valve. The dopant container includes a wall defining a lower opening for releasing the dopant therethrough. The lower valve is positioned adjacent the lower opening and is movable between a closed position that is in contact with the wall to prevent passage of dopant through the lower opening and an open position that is spaced from the lower opening to allow passage of dopant therethrough. The upper valve is positioned above and connected to the lower valve. The upper valve is disposed within the dopant container and is movable between a first position that is spaced from the dopant container and a second position that is in contact with the dopant container.

Another aspect is a method for releasing a predetermined amount of a dopant for use in a feeding system with a dopant feeding device having a dopant container and an upper valve and a lower valve. The dopant container includes a wall defining a lower opening for release of the dopant therethrough. The method includes loading the dopant container with dopant and positioning the lower valve within the lower opening to prevent passage of dopant therethrough. The method further includes positioning the upper valve in spaced relation to the wall of the dopant container to allow dopant from the dopant container to pass between the upper valve and the wall of the dopant container. Additionally, the method includes causing movement of the lower valve to a position that is spaced from the lower opening to allow passage of dopant and causing movement of the upper valve to contact the dopant container to prevent dopant from the dopant container from passing between the upper valve and the wall of the dopant container.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
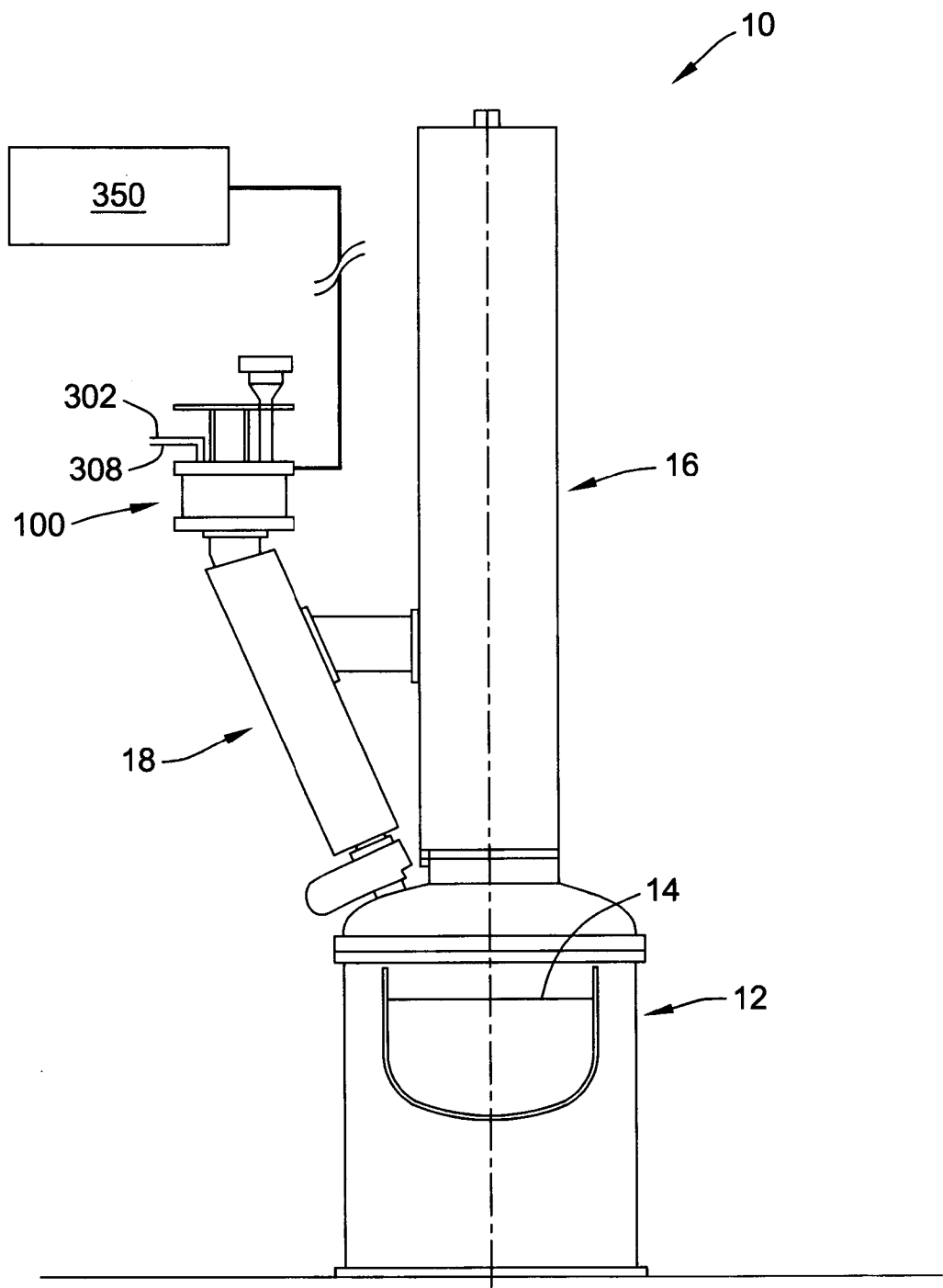
FIG. 1 is a front elevation of a crystal growing system in accordance with one embodiment.

Referring to FIG. 1, a crystal growing system for the production of single crystal ingots by a Czochralski process is generally indicated at 10. The system 10 includes a furnace 12 having or a melt 14 or a molten silicon charge located therein, a puller 16 for lowering a seed crystal into the melt and raising the single crystal ingot therefrom, a gas doping system 18 for introducing a dopant into the furnace, and a dopant feeding device 100 for dispensing dopant to dope the melt.

Figure 2:
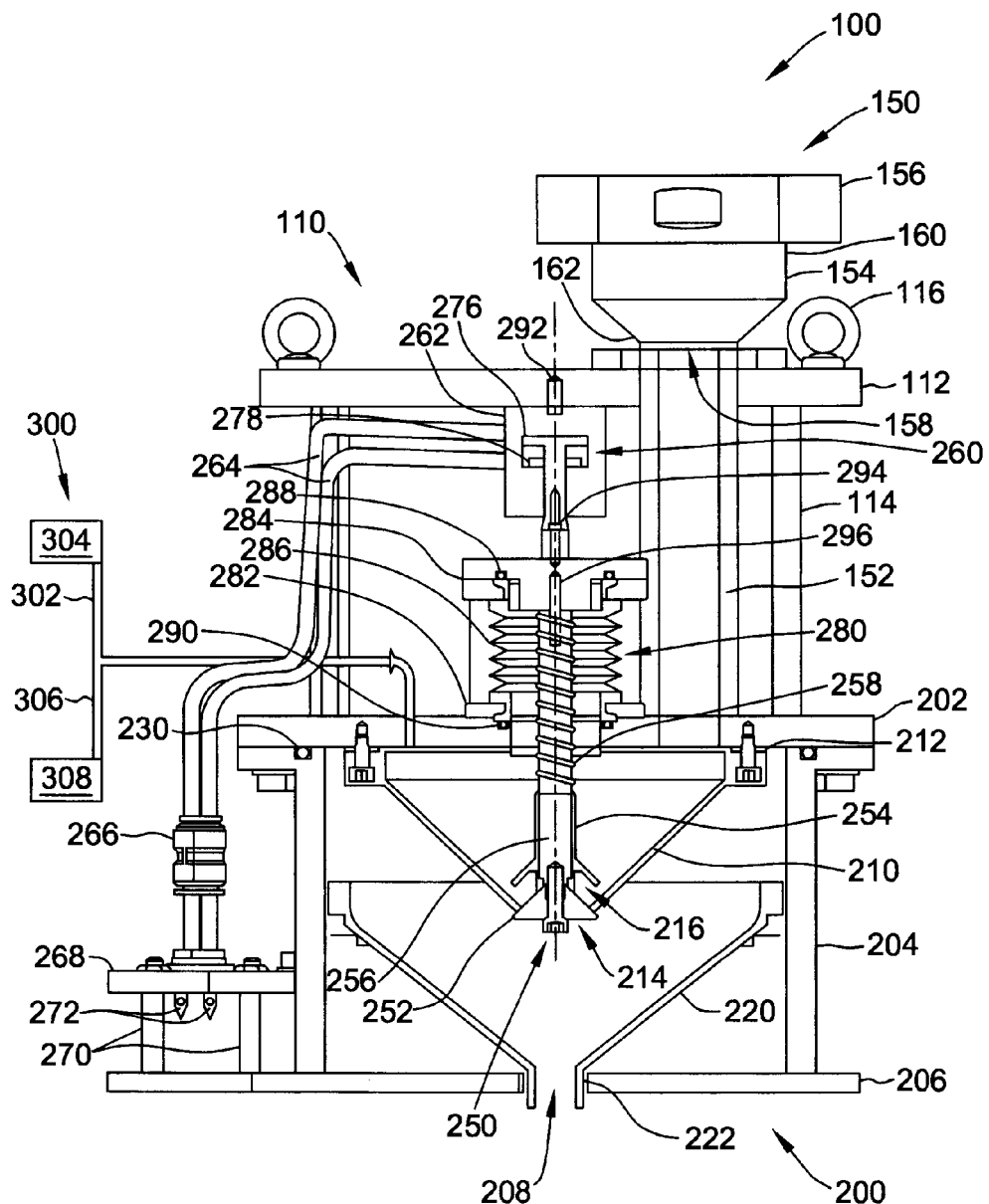
FIG. 2 is a cross sectional view of a dopant feeding device in accordance with FIG. 1.

Referring to FIG. 2, the dopant feeding device 100 of this embodiment is not permanently connected with the furnace and is mobile, allowing it to be used on multiple furnaces. The dopant feeding device can be used for all types of p-type and n-type dopant. The dopant feeding device 100 provides a controlled releasing of a predetermined amount of dopant in the form of a charge. The dopant feeding device 100 includes a support assembly 110, a fill assembly 150, a hopper 200, a double valve system 250, a purging system 300, and a control system 350 (shown in FIG. 1).

The support assembly 110 includes a fixing plate 112 held in spaced relation to the hopper 200 by a plurality of distance holders 114. The fixing plate 112 has a plurality of hooks 116 for transporting the dopant feeding device 100 between furnaces (not shown). The dopant feeding device 100 of this embodiment is not permanently attached to a particular furnace, and is able to be used on multiple furnaces. The hooks 116 may be connected with a lifting device, e.g. a chain block or other suitable device (not shown), for moving the dopant feeding device 100 between the different furnaces. In other embodiments, the dopant feeding device 100 is not mobile and instead is fixed to a furnace.

The fill assembly 150 includes a feed tube 152 connected with a fill port 154 located above the fixing plate 112, the feed tube 152 extends through the fixing plate and down into the hopper 200.

The fill port 154 includes a lid 156 having a complimentary internal structure to the fill port 154 to form the seal therebetween. In some embodiments, the lid 156 has a pressure release valve (not shown) for equalizing pressure between the space internal to the fill port and the space external to the lid.

The fill port 154 includes a passageway 158 therethrough that is larger at a top end 160 than at a bottom end 162, forming a funnel to ease loading of dopant into the feed tube 152. To load dopant into the dopant feeding device 100, the lid 156 is removed and dopant is poured into the fill port 154. The dopant falls down the feed tube 152 and is stored in the hopper 200.

The hopper 200 includes an upper plate 202, a surrounding wall 204, and a ground plate 206. The upper plate 202 is connected to and sealed with an O-ring 230 to the top of the surrounding wall 204. The surrounding wall 204 is located on top of the ground plate 206.

A dopant container 210 for storing the dopant is located inside of the hopper 200 and is connected with the lower end of the feed tube 152 so that the dopant can fall into the dopant container from the dopant feeding tube. The dopant container 210 is mounted to the upper plate 202 of the hopper 200 with spacers 212. The spacers 212 prevent the dopant container 210 from being closed off to the rest of the internal volume of the hopper 200 and allow inert gas to flow out of the dopant container 210. The dopant container 210 has a lower opening 214 that is connected with a dopant funnel 220 through the double valve system 250. The dopant funnel 220 includes an exit 222 at its lowermost point that releases dopant into the furnace 12 or feed system 18 through a communication hole 208 in the ground plate 206 of the hopper 200.

The double valve system 250 includes a lower valve 252 and an upper valve 254. The lower valve 252 is connected with a pneumatic actuator 260, e.g., by a rod 256. The pneumatic actuator 260 is mounted to the fixing plate 112 and has an actuator body 262 that is aligned with the center of the fixing plate through a centering pin 292. The actuator body 262 includes a top, a bottom, and sides extending therebetween. The top and bottom of the actuator body 262 limit vertical movement of a piston 276 located within the actuator body. A spacer or distance plate 278 is positioned between a lower, internal surface of the actuator body 262 and a lower surface of the piston 276.

The piston 276 is connected with a bellows system 280. A second centering pin 294 aligns the piston 276 and the bellows system 280. The bellows system 280 includes a lower flange 282 that is attached to the upper plate 202 of the hopper 200 and an upper flange 284 spaced vertically from the lower flange 282. The upper flange 284 is connected with the piston 276. The rod 256 is connected with and extends from the upper flange 284 of the bellows system 280 down to the lower valve 252. A third centering pin 296 aligns the rod 256 with the center of the upper flange 284. Vertical movement of the piston 276 produces vertical movement of a portion of the bellows system 280 causing the rod 256 to move vertically, which moves the lower valve 252 vertically.

All movable parts are coaxially aligned with the lower opening 214 through the dopant container 210 by centering pins 292, 294, and 296, which ensure alignment between the various parts.

A bellows 286 is sealed to the upper flange 284 with an O-ring 288 and extends downward through the lower flange 282. The bellows 286 is sealed to the upper plate 202 of the hopper 200 with another O-ring 290. The O-ring seals 288, 290 prevent leakage of gas from around the rod 256, e.g., gas that passes through the upper plate 202 of the hopper 200.

The lower valve 252 is conical in shape to allow it to be pulled upward and into the lower opening 214. The upper valve 254 has the shape of a conical frustum to allow dopant to fall down and around the upper valve and into the space under the upper valve. The conical shape of the lower valve 252 automatically centers the lower valve with respect to the opening 214 of the dopant container 210 when the lower valve is closed.

In some embodiments, the lower valve and upper valve may have other sizes and shapes based on the size and shape of the dopant container and corresponding to the size and shape of the dopant granules to be used in the dopant feeding system.

The upper valve 254 has the ability to slide vertically along a portion of the rod 256. The lower valve 252 is attached to the bottom of the rod 256 and retains the upper valve 254 on the rod.

A spring 258 surrounds the rod 256 and extends from within the bellows system 280 to the upper valve 254 to bias the upper valve downward toward the lower valve 252. Downward movement of the rod 256 pushes the lower valve 252 down causing the lower valve to move away from the lower opening 214 and to open. As the lower valve 252 is moved downward, the spring 258 expands and forces the upper valve 254 down also. The downward movement of the upper valve 254 is limited by contact of the upper valve with the dopant container 210 causing the upper valve to close against the dopant container. Upward movement of the rod 256 pulls the lower valve 252 up to close the lower valve against the lower opening 214. As the lower valve 252 is raised, it reacts against the bottom of the upper valve 254 forcing the upper valve up, compressing the spring 258.

The lower valve 252 and upper valve 254 work together to release a preset amount of dopant called a dopant charge. This preset dopant charge is more precisely controlled than a dopant charge from a standard single exit valve, which is generally located on the bottom of a dopant container.

The double valve system 250 allows the dopant charge to be released in smaller or larger portions, over a variety of times, depending on the preset parameters of the upper valve 254. The dopant charge size and the time between dopant releases can be reduced to a minimum to provide a "quasi-continuous feeding."

During operation, dopant located in the dopant container 210 passes by the upper valve 254 to fill a chamber 216 defined as being between the upper valve and the dopant container. The volume of this chamber 216 defines the dopant charge or the amount of dopant to be released by the next opening 214 of the lower valve 252.

As discussed above, opening the lower valve 252 closes the upper valve 254 and prevents additional dopant from entering the chamber 216. Opening the valve also releases the limited amount of dopant that is within the chamber. As a result, the size of every dopant charge is independent of the time the double valve system 250 is open, pressure fluctuations within the dopant feeding device 100, and differences in mechanical response times for the double valve system 250.

The maximum translation distance of the piston 276 of the actuator 260 may be limited by or set with distance plates 278 having different heights or by combining two or more different distance plates having the same or different heights. The pneumatic actuator 260 is connected to two fittings 266 via two tubes 264 that are installed on a small adapter plate 268. This adaptor plate 268 is attached to the ground plate 206 of the hopper 200 with spacers 270.

Two quick connect systems 272 are mounted to the adapter plate 268 as inlets for compressed air to allow the dopant feeding device 210 to be mounted and demounted without the use of tools. The tubes 264 may have a pressure gauge (not shown) installed to indicate the working pressure inside the tubes 264. Applying air pressure through one or the other of these tubes 264 to one side or the other of the piston 276 forces the piston, lower valve 252, and upper valve 254 down or up, respectively.

Since the upper valve 254 is able to slide on the rod 256, the pneumatic actuator 260 pushes the rod down and the lower valve 252 opens and the upper valve 254 closes against the dopant container 210, pressed down by the spring 258. Once the upper valve 254 touches the inside of the dopant container 210, the rod 265 continues downward pushing the lower valve 252 farther downward. As the lower valve 252 is forced down and away from the dopant container 210, the lower opening 214 in the dopant container is opened releasing the dopant charge encapsulated in the chamber 216. Opening the lower valve 252 closes the upper valve 254 preventing additional dopant from entering and falling out of the dopant chamber 216 through the lower opening 214.

Once the lower valve 252 is opened and the dopant falls out of the chamber 216, the dopant enters into the dopant funnel 220 located below the dopant container 210. The dopant then travels into and through the communication hole 208 of the dopant funnel 220 into the feeder system located below the hopper 200.

The double valve system 250 is actuated by the pneumatic actuator 260, which is independent of the crystal pulling furnace. The dopant feeding system 100 is independent from the furnace and thereby provides a mobile device that can be removed from a furnace without disconnecting wires or sensors. The supply of pressurized air is connected with the dopant feeding device through a quick connection system that may be coupled to the dopant feeding device when the dopant feeding device is installed.

Upward movement of the pneumatic actuator 260 pulls the double valve into an upper position. As the lower valve 252 is raised, the upper valve 254 is pushed upward so that the upper valve 254 opens when the lower valve 252 closes. This double valve provides a dopant charge size that is repeatable.

Repeating the opening and closing of the double valve system 250 allows all of the dopant in the dopant container 210 to be released over a preset amount of time. The timing of the operation of the double valve system 250 may be set, e.g., in a controller or in controller parameters to allow the dopant release to be automatically controlled.

The dopant feeding device 100 includes the purging system 300 to prevent contaminants (for example, air and moisture) from entering the furnace. The purging system 300 includes a first connection 302 connected with an inert gas or argon supply 304 and a second connection 306 having a vacuum port 308 that is connected with a vacuum source. Together the argon supply 304 and vacuum port 308 act to purge the dopant feeding device 100 before and during the doping step. The hopper 200 has two connections to argon. One connection is the argon inlet port or the first connection 302 and one is the communication hole 208 in the hopper ground plate 206. The communication hole 208 allows argon gas to be exchanged with the feeder system 18.

The pneumatic actuator 260 is suitably controlled by the control system 350 or controller, e.g., a computer processor. The controller automatically regulates the partial- and the total-doping times through software (SW) parameters. The controller provides control of parameters associated with the amount and the timing of dopant being released. These preset controller parameters provide automated control of the pneumatic actuator 260. In some embodiments, these parameters can be adjusted in the controller during the dopant process.

The opening and closing of the double valve system 250 is controlled through the timing parameters of the controller which control the release of the dopant charge by regulating the pneumatic actuators 260. The double valve system 250 eliminates unwanted variation in the quantity of the released dopant charges, e.g., variations caused by deviations in mechanical responses of the previously used pneumatic flap systems. However, the double valve system 250 may also be used to vary, as needed, the dopant quantity being released by adjustment of the height of the upper valve 254 with respect to the lower valve 252.

The controller has preset controller parameters to automatically control the doping process. The pneumatic actuator 260 is connected with a double valve system 250 to provide a preset amount of dopant charge based on the preset controller parameters. The upper valve 254 of the double valve system 250 and the controller parameters may be changed to allow the dopant charge to be released in smaller or larger portions over a specified time. The dopant charge size and the time between dopant charge releases can be reduced to a minimum to obtain a "quasi-continuous feeding".

The dopant in the dopant container 210 is gravity fed into the chamber 216 under the upper valve 254 to fill the space between the upper valve, the lower valve 252, and the dopant container 210. The amount of dopant in the chamber 216 is released by the opening of the lower valve 252. Opening the lower valve 252 to release the limited amount of dopant charge causes the upper valve 254 to close and prevents further dopant from being fed into and exiting the dopant chamber 216. The size of the released dopant charge is independent of the amount of time the lower valve remains open. Thus, the size of the dopant charge is also independent from pressure fluctuations and the different mechanical response times for the valve system.

To load the dopant feeding device, the pressure inside the device is stabilized at atmosphere pressure. The lid 156 of the dopant filling port 154 may then be removed to load the dopant feeding device 100 with dopant. The dopant is collected in the dopant container 210, and is retained therein by the lower valve 252. As the dopant collects within the dopant container 210, the chamber 216 under the upper valve 254 is filled with dopant.

The dopant feeding device 100 may be purged with argon, to displace contaminates (air, oxygen, and moisture or other contaminants) within the device. This is suitably done by applying a vacuum that is greater than 100 mbar to remove contaminates from inside the device. The vacuum source may be attached to the first connection 302.

Additionally, the dopant feeding device 100 is connected to a feeder system through the communication hole 208. A vacuum may also be connected with the communication hole 208 to allow the contaminants to be removed from the hopper 200 very efficiently. This removal step may be repeated several times to ensure a complete absence of contaminates within the dopant feeding device 100.

A high argon flow may be used to keep the inside of the device clean from deposited powders derived from normal usage. After purging the device, a leak test may be performed by evacuating the device and monitoring the internal pressure, which will increase if there is a leak in the dopant feeding device 100.

After the dopant feeding device 100 is loaded with dopant through the fill port 154 in the top of the dopant feeding device, the complete dopant feeding device is evacuated and then filled with argon. This cycle may be repeated one or more times (normally 3 times) to reduce the risk of contaminates remaining within the inside of the dopant feeding device 100. Fluxing the dopant feeding device 100 during the doping step is required for some doping techniques, such as gas doping because a back stream of evaporated dopant must be avoided. Continuously fluxing of the dopant feeding device prevents the formation of oxides (e.g. silicon oxide), accumulation of dust in the feeding unit, and dopant vapor back stream can be avoided.

Use of devices consistent with this disclosure provides a controlled dopant release. In addition, the amount of dopant that is released per charge is independent of the granular size and the shape of the granules. Furthermore, the devices provide automatic control of the timing of dopant release during the doping step of the Czochralski process. Timing control of the dopant step enables more efficient doping of the silicon melt, keeps the hot zone of the furnace cleaner, and provides precise delivery of the dopant for certain doping techniques.

During operation, the lower valve must open or move enough to create a distance between the lower valve and the dopant container that is greater than the diameter of the dopant granules to allow the dopant to pass thereby. Once the lower valve is opened enough to release the dopant, the upper valve sits on and slides down with the dopant as the dopant located within the chamber is released. When the chamber is empty, additional dopant is prevented from entering the chamber because the distance between the upper valve and the dopant container is too small to allow other granules to pass therebetween. Additionally, the operation of the pneumatic actuator is too fast to allow additional dopant to enter the dopant chamber.

The devices enable the quantity of every dopant charge released by the dopant feeding device to be controlled through the internal double valve system. The double valve allows setting the required dopant amount for every feeding step, guaranteeing a homogeneous feeding of a charge of the dopant. The standardized size of dopant charge is an important parameter for the doping step during the Czochralski process, and enables new doping techniques, such as fully automatic gas doping process.

Another advantage of the devices is that the amount of released dopant charge is independent from the time the valve remains open and closed. As a result, the process of dopant feeding is repeatable and can be standardized. Thus, the variations in the amount of released dopant charges caused by pressure fluctuations or mechanical timing problems of the valve are eliminated. Further, the devices may be used with all types of p-type and n-type dopant.

When introducing elements of the present disclosure or the embodiments thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawings shall be interpreted as illustrative and not in a limiting sense.

The invention claimed is:

1. A dopant feeding device for releasing dopant into a feeder system during doping of a crystal growing system, the dopant feeding device comprising:
   a dopant container for holding the dopant, the dopant container including a wall defining a lower opening for releasing the dopant therethrough;
   a lower valve positioned adjacent the lower opening, the lower valve being movable between a closed position in contact with the wall to prevent passage of dopant through the lower opening and an open position spaced from the lower opening to allow passage of dopant;
   an upper valve positioned above and connected to the lower valve, the upper valve disposed within the dopant container, the upper valve being movable between a first position spaced from the dopant container and a second position in contact with the dopant container; and
   a pneumatic actuator connected with the lower valve to move the lower valve from the closed position to the open position, wherein the pneumatic actuator is connected with the lower valve through a rod.

2. The dopant feeding device of claim 1, further comprising a spring located around the rod to bias the upper valve toward the lower valve.

3. The dopant feeding device of claim 1, further comprising a purging system to remove contaminants from within the dopant feeding device.

4. The dopant feeding device of claim 3, wherein the purging system includes a vacuum connection to evacuate the dopant feeding device of contaminants and an inert gas connection to pressurize the dopant feeding device.

5. The dopant feeding device of claim 1, further comprising a controller to regulate movement of the pneumatic actuator and positions of the lower valve and the upper valve.

6. The dopant feeding device of claim 1, further comprising a fill port connected with the dopant container to load the dopant into the dopant container.

7. The dopant feeding device of claim 6, further comprising a lid connected to the fill port to form a seal therebetween to allow pressurization of the dopant feeding device.

8. A method for releasing a predetermined amount of a dopant for use in a feeder system with a dopant feeding device having a dopant container and an upper valve and a lower valve, the dopant container including a wall defining a lower opening for release of the dopant therethrough, the method comprising:
  loading the dopant container with dopant;
  positioning the lower valve within the lower opening to prevent passage of dopant therethrough;
  positioning the upper valve in spaced relation to the wall of the dopant container to allow dopant from the dopant container to pass between the upper valve and the wall of the dopant container;
  causing movement of the lower valve to a position spaced from the lower opening to allow passage of dopant; and
  causing movement of the upper valve to contact the dopant container to prevent dopant from the dopant container from passing between the upper valve and the wall of the dopant container, wherein the movement of both the lower valve and the upper valve are caused by activation of a single pneumatic actuator connected with both the lower valve and the upper valve.

9. The method of claim 8, further comprising the step of purging the dopant feeding device of contaminants.

10. The method of claim 9, wherein the purging step includes evacuating the dopant feeding device by a vacuum connected with the dopant feeding device.

11. The method of claim 9, wherein the purging step includes injecting an inert gas into the dopant feeding device.

12. The method of claim 11, wherein the inert gas injected into the dopant feeding device is argon.

13. The method of claim 8, further comprising the step of positioning the dopant feeding device adjacent to the feeder system to allow dopant released from the dopant feeding device to enter into the feeder system.

\* \* \* \* \*